US009656300B2

(12) United States Patent
Yamamoto

(10) Patent No.: US 9,656,300 B2
(45) Date of Patent: May 23, 2017

(54) UNIMORPH-TYPE ULTRASOUND PROBE

(71) Applicant: FUJIFILM Corporation, Tokyo (JP)

(72) Inventor: Katsuya Yamamoto, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/844,802

(22) Filed: Sep. 3, 2015

(65) Prior Publication Data

US 2015/0375265 A1 Dec. 31, 2015

Related U.S. Application Data

(63) Continuation of application No. PCT/JP2014/057812, filed on Mar. 20, 2014.

(30) Foreign Application Priority Data

Mar. 28, 2013 (JP) ................................ 2013-069657

(51) Int. Cl.
*H01L 41/04* (2006.01)
*B01B 1/06* (2006.01)
*B06B 1/06* (2006.01)

(52) U.S. Cl.
CPC ................................ *B06B 1/0622* (2013.01)

(58) Field of Classification Search
CPC ..... H04R 17/00; B06B 1/0622; B06B 1/0629; B06B 1/067

(Continued)

(56) References Cited

U.S. PATENT DOCUMENTS 4,242,912 A * 1/1981 Burckhardt .............. A61B 8/14 310/334
6,262,946 B1 7/2001 Khuri-Yakub et al.
(Continued)

FOREIGN PATENT DOCUMENTS

CN 1682663 A 10/2005
JP 2-41144 A 2/1990
(Continued)

OTHER PUBLICATIONS

International Preliminary Report on Patentability and the English translation of the Written Opinion of the International Searching Authority (Forms PCT/IB/338, PCT/IB/373 and PCT/ISA/237), dated Oct. 8, 2015, for International Application No. PCT/JP2014/057812.

(Continued)

*Primary Examiner* — Thomas Dougherty
(74) *Attorney, Agent, or Firm* — Birch, Stewart, Kolasch & Birch, LLP

(57) ABSTRACT

A unimorph-type ultrasound probe has a plurality of piezoelectric element regions which extend in a minor axis direction and are arranged at a predetermined arrangement pitch in a major axis direction, a plurality of minute piezoelectric element portions are formed so as to be arranged in each piezoelectric element region, the size of the plurality of minute piezoelectric element portions is changed in the minor axis direction, the plurality of minute piezoelectric element portions are arranged such that the size of the piezoelectric element portions in both end portions in the minor axis direction becomes smaller than the size of the piezoelectric element portions in a central portion in the minor axis direction, and ultrasonic waves having different frequencies are radiated from the piezoelectric element portions having different sizes.

2 Claims, 4 Drawing Sheets

(58) Field of Classification Search
USPC .......................... 310/320–322, 324, 334, 369
See application file for complete search history.

(56) References Cited

U.S. PATENT DOCUMENTS

| | | | | | |
|---|---|---|---|---|---|
| 7,427,797 | B2 | 9/2008 | Ohguro et al. | | |
| 8,698,377 | B2 * | 4/2014 | Sinelnikov | A61N 7/00 | 310/326 |
| 2005/0261590 | A1 | 11/2005 | Ogawa et al. | | |
| 2008/0013405 | A1 * | 1/2008 | Moon | B06B 1/0629 | 367/92 |
| 2009/0108708 | A1 * | 4/2009 | Jiang | B06B 1/0622 | 310/334 |
| 2013/0293065 | A1 * | 11/2013 | Hajati | B06B 1/0629 | 310/334 |
| 2013/0294201 | A1 * | 11/2013 | Hajati | H01L 41/047 | 367/138 |
| 2013/0310693 | A1 * | 11/2013 | Tsuruno | B06B 1/0607 | 600/459 |
| 2014/0117812 | A1 * | 5/2014 | Hajati | B06B 1/0276 | 310/314 |
| 2015/0158052 | A1 * | 6/2015 | Latev | B06B 1/0622 | 310/316.01 |
| 2015/0289843 | A1 * | 10/2015 | Wada | A61B 8/4461 | 600/459 |

FOREIGN PATENT DOCUMENTS

| | | | |
|---|---|---|---|
| JP | 5-38335 | A | 2/1993 |
| JP | 2006-75425 | A | 3/2006 |
| JP | 2006-140271 | A | 6/2006 |

OTHER PUBLICATIONS

Chinese Office Action and Search Report dated Mar. 24, 2016, for Chinese Application No. 201480018927.6 with the English translation of the Office Action.

International Search Report, issued in PCT/JP2014/057812, dated May 13, 2014.

Chinese Office Action issued Oct. 27, 2016 in corresponding Chinese Application No. 201480018927.6 with an English Translation.

Chinese Office Action dated Jan. 16, 2017 issued in the corresponding Chinese Patent Application No. 201480018927.6 with an English Translation.

* cited by examiner

UNIMORPH-TYPE ULTRASOUND PROBE

CROSS-REFERENCE TO RELATED APPLICATIONS

This application is a Continuation of PCT International Application No. PCT/JP2014/057812 filed on Mar. 20, 2014, which claims priority under 35 U.S.C. §119(a) to Japanese Patent Application No. 2013-069657 filed on Mar. 28, 2013. The above application is hereby expressly incorporated by reference, in its entirety, into the present application.

BACKGROUND OF THE INVENTION

The present invention relates to a unimorph-type ultrasound probe, and in particular, to a unimorph-type ultrasound probe for achieving reduction in a side lobe in a minor axis direction.

Conventionally, in the medical field, an ultrasound diagnostic apparatus using ultrasound images has been put to practical use. Generally, in this type of ultrasound diagnostic apparatus, an ultrasonic beam is transmitted toward the inside of a subject from an ultrasound probe, an ultrasonic echo from the subject is received by the ultrasound probe, and the received signal is electrically processed, thereby generating an ultrasound image.

It is known that, when an ultrasonic beam is transmitted from an ultrasound probe, not only a main lobe having high sound pressure is radiated on a central axis in a transmission direction, but also a side lobe having low sound pressure is radiated in a direction deviated from the central axis. An ultrasonic echo from a reflector positioned on the side lobe is received along with an ultrasonic echo due to the main lobe, which causes a problem in that an ultrasound image becomes unclear.

As a method of reducing a side lobe, a method, called apodization, is generally used. This method is a method in which, instead of applying a uniform voltage to each transducer of a transducer array arranged in a major axis direction as shown in FIG. 9A, by applying a lower voltage to a transducer positioned closer to the end portion of the array as shown in FIG. 9B, the radiation of an ultrasonic beam from the end portion of the array is suppressed to narrow down the ultrasonic beam. By the method, it is possible to reduce a side lobe which is radiated in the direction deviated from the central axis.

In a one-dimensional array in which transducers are arranged in a row in a major axis direction, it is possible to use the apodization with respect to the major axis direction. However, since only one transducer exists in a minor axis direction, it is not possible to reduce a side lobe with respect to the minor axis direction using the apodization.

Accordingly, for example, JP 02-41144 A discloses an ultrasound probe in which a piezoelectric substance constituting each transducer is shaped so as to have a so-called rhombic planar shape of which the width becomes narrower toward the end portion in a minor axis direction, and these shaped piezoelectric substances are arranged in a major axis direction.

By causing the piezoelectric substance to have such a planar shape, in each transducer, an ultrasonic beam which is radiated from the end portion in the minor axis direction is suppressed, and an ultrasonic beam which is narrowed down in the minor axis direction can be formed. With this, it is possible to achieve reduction in a side lobe even in the minor axis direction.

However, it is not easy to shape a bulk piezoelectric substance made of a conventional inorganic material so as to have a rhombic planar shape. Although an attempt to realize a piezoelectric substance having a rhombic planar shape using a dicing saw was made, it was necessary to carry out special cutting in a direction inclined with respect to the arrangement direction of the piezoelectric substances, and a lot of labor, time, and cost were required.

SUMMARY OF THE INVENTION

The present invention has been accomplished in order to solve the aforementioned problems in the prior art, and an object of the invention is to provide a unimorph-type ultrasound probe capable of facilitating manufacturing while reducing a side lobe in the minor axis direction.

A unimorph-type ultrasound probe according to the present invention has a plurality of piezoelectric element regions which extend in a minor axis direction and are arranged at a predetermined arrangement pitch in a major axis direction, a plurality of minute piezoelectric element portions being formed so as to be arranged in each of the piezoelectric element regions, the size of the plurality of minute piezoelectric element portions being changed in the minor axis direction, the plurality of minute piezoelectric element portions being arranged such that the size of the piezoelectric element portions in both end portions in the minor axis direction becomes smaller than the size of the piezoelectric element portions in a central portion in the minor axis direction, ultrasonic waves having different frequencies being radiated from the piezoelectric element portions having different sizes.

DETAILED DESCRIPTION OF THE INVENTION

Hereinafter, embodiments of the present invention will be described based on the attached drawings.

Embodiment 1

Figure 1:
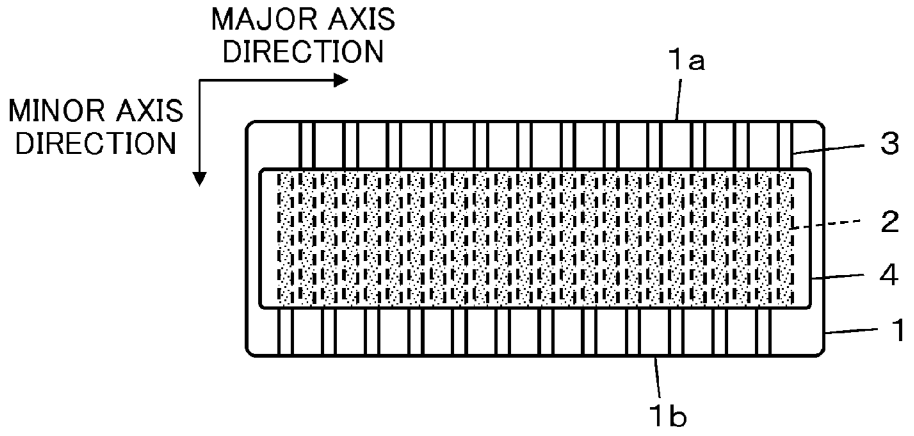
FIG. 1 is a plan view showing the configuration of a unimorph-type ultrasound probe according to Embodiment 1 of the present invention.

FIG. 1 shows the constitution of a unimorph-type ultrasound probe according to Embodiment 1 of the present invention.

In the unimorph-type ultrasound probe, a plurality of piezoelectric element regions 2 are formed on a surface of a substrate 1. Each of the piezoelectric element regions 2 extends in the form of a strip in a minor axis direction (elevation direction), and is arranged at a small interval in a major axis direction (azimuth direction). A plurality of minute piezoelectric element portions are formed so as to be arranged in each of the piezoelectric element regions 2. Furthermore, each of the piezoelectric element regions 2 is connected to a corresponding lead-out electrode 3 in the minor axis direction. The lead-out electrodes 3 alternately extend in any one of a pair of lateral edges 1*a* and 1*b* of the substrate 1 so as to ensure an arrangement pitch therebetween.

Moreover, a covering layer 4 is disposed on the substrate 1 so as to cover all of the piezoelectric element regions 2.

Figure 2:
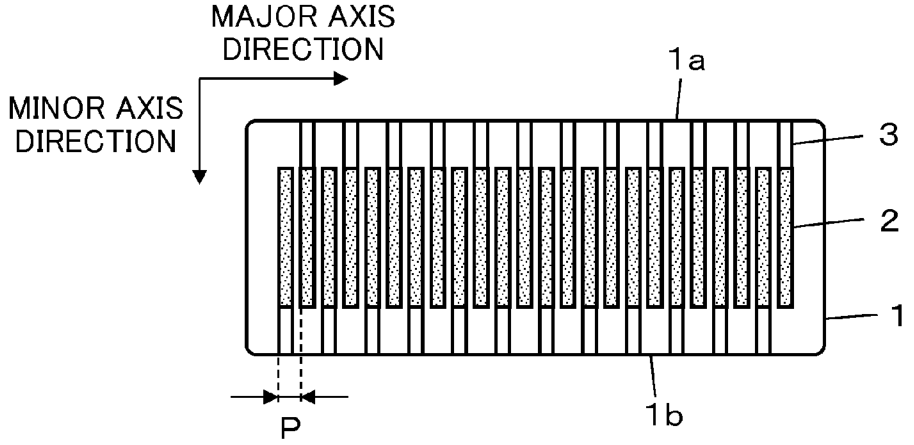
FIG. 2 is a plan view showing the unimorph-type ultrasound probe according to Embodiment 1 from which a covering layer has been removed.

FIG. 2 showing the state in which the covering layer 4 has been removed clearly shows the plurality of piezoelectric element regions 2 each of which extends in the minor axis direction. The piezoelectric element regions 2 are arranged in the major axis direction with a pitch P1.

Figure 3:
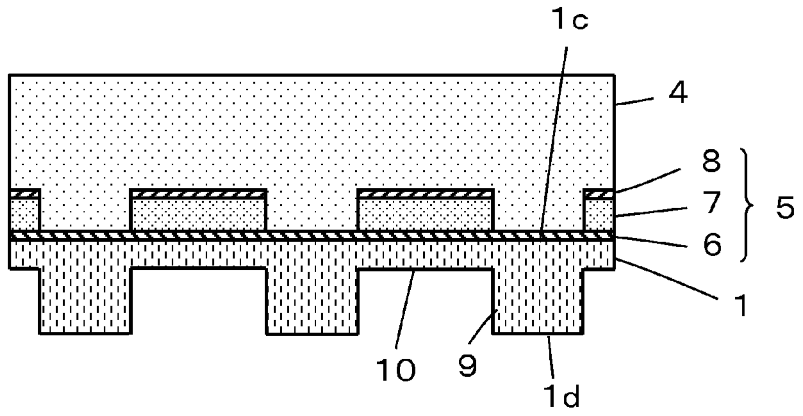
FIG. 3 is a cross-sectional view showing the main portions of the unimorph-type ultrasound probe according to Embodiment 1.

As shown in FIG. 3, each of the plurality of minute piezoelectric element portions 5 arranged in the piezoelectric element regions 2 has a lower electrode layer 6 that is formed on a surface 1*c* of the substrate 1, a piezoelectric substance layer 7 that is formed on the lower electrode layer 6, and a upper electrode layer 8 that is formed on the piezoelectric substance layer 7. The piezoelectric substance layer 7 has a regular octagonal planar shape, and the upper electrode layer 8 is formed to be the same regular octagonal shape as the piezoelectric substance layer 7.

A plurality of openings 9 are formed on a rear surface 1*d* side of the substrate 1 corresponding to the arrangement positions of the piezoelectric element portions 5, whereby thin vibration plates 10 are formed, and the piezoelectric element portions 5 are arranged on the corresponding vibration plates 10.

Furthermore, all of the piezoelectric element portions 5 formed on the substrate 1 are covered with the covering layer 4. The covering layer 4 has such a thickness that an acoustic matching condition for the operation frequency of the unimorph-type ultrasound probe, that is, a ¼-wavelength condition, is satisfied.

Figure 4:
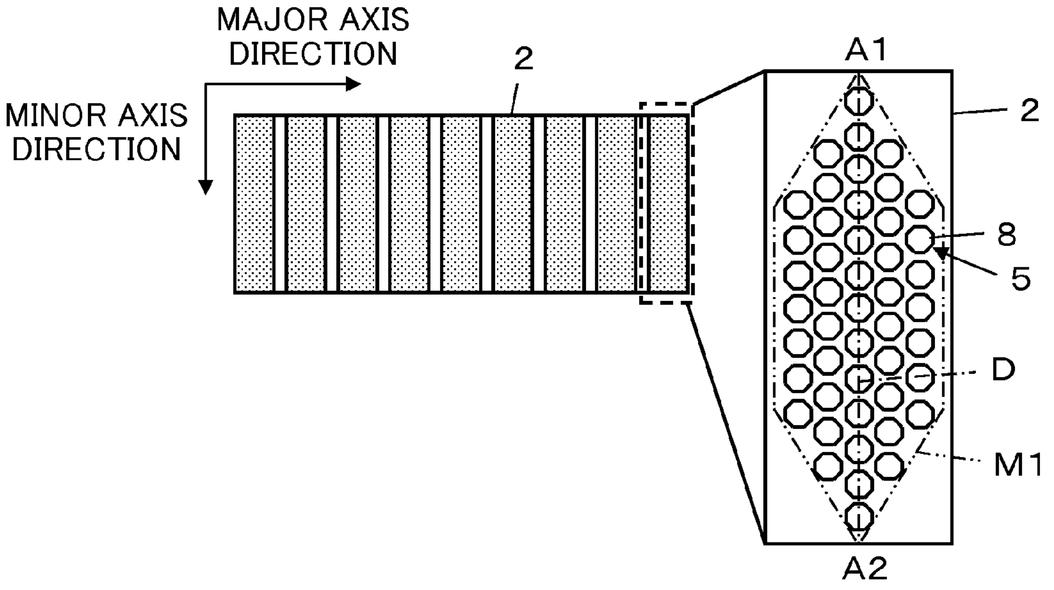
FIG. 4 is a partially enlarged plan view showing a plurality of minute piezoelectric element portions formed in a piezoelectric element region of the unimorph-type ultrasound probe according to Embodiment 1.

As shown in FIG. 4, the plurality of minute piezoelectric element portions 5 are not arranged over the entire surface of each of the piezoelectric element regions 2, but are arranged so as to be spread all over the inside of a range of a hexagon M1 set in the piezoelectric element region 2. In the hexagon M1, a diagonal D passing through the center thereof is directed toward the minor axis direction, and a pair of apexes A1 and A2 on the diagonal D are respectively positioned at the end portions of the piezoelectric element region 2 in the minor axis direction. Therefore, the plurality of minute piezoelectric element portions 5 spread all over the inside of the range of the hexagon M1 are arranged such that the number of piezoelectric element portions 5 in both end portions in the minor axis direction becomes smaller than the number of piezoelectric element portions 5 in the central portion in the minor axis direction.

The upper electrode layers 8 having a regular octagonal planar shape and constituting the piezoelectric element portions 5, which are spread all over the inside of the range of the hexagon M1, are connected with each other in the same piezoelectric element region 2 and are connected to the corresponding lead-out electrode 3, and the piezoelectric substance layers 7 are separated for each piezoelectric element portions 5. In addition, the lower electrode layers 6 of the piezoelectric element portions 5 formed so as to be arranged in all of the piezoelectric element regions 2 are connected with each other and form one electrode layer on the front surface 1*c* of the substrate 1.

Such a unimorph-type ultrasound probe can be manufactured by partially processing the substrate 1 made of silicon or the like to form the vibration plates 10 and sequentially laminating the lower electrode layers 6, the piezoelectric substance layers 7, and the upper electrode layers 8 on the vibration plates 10, by means of patterning using a micromachining technique. Since the probe is manufactured using the micromachining technique without cutting bulk piezoelectric substances, it is possible to easily form the plurality of minute piezoelectric element portions 5 so as to be spread all over the inside of the range of the hexagon M1.

Figure 5:
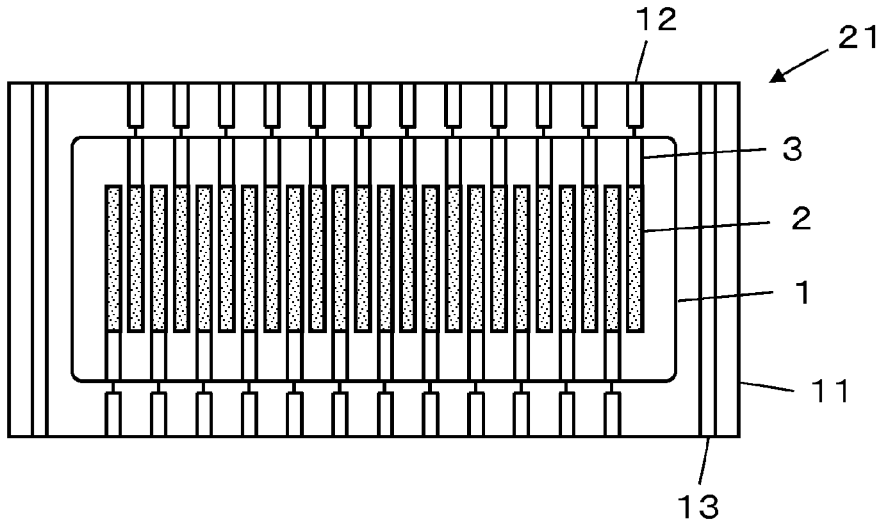
FIG. 5 is a plan view showing a state where the unimorph-type ultrasound probe according to Embodiment 1 is mounted on an FPC (flexible printed circuit).

If a probe having no covering layer 4 shown in FIG. 2 is prepared, then, as shown in FIG. 5, the probe in this state is mounted on an FPC (flexible printed circuit) 11 or the like, the plurality of lead-out electrodes 3 are connected to corresponding wiring patterns 12 of the FPC 11, and the lower electrode layer 6 common to all of the piezoelectric element portions 5 is connected to a ground pattern 13 of the FPC 11. Thereafter, the covering layer 4 is coated on the substrate 1 so as to cover all of the piezoelectric element regions 2, whereby a unimorph-type ultrasound probe 21 is completed.

Figure 6:
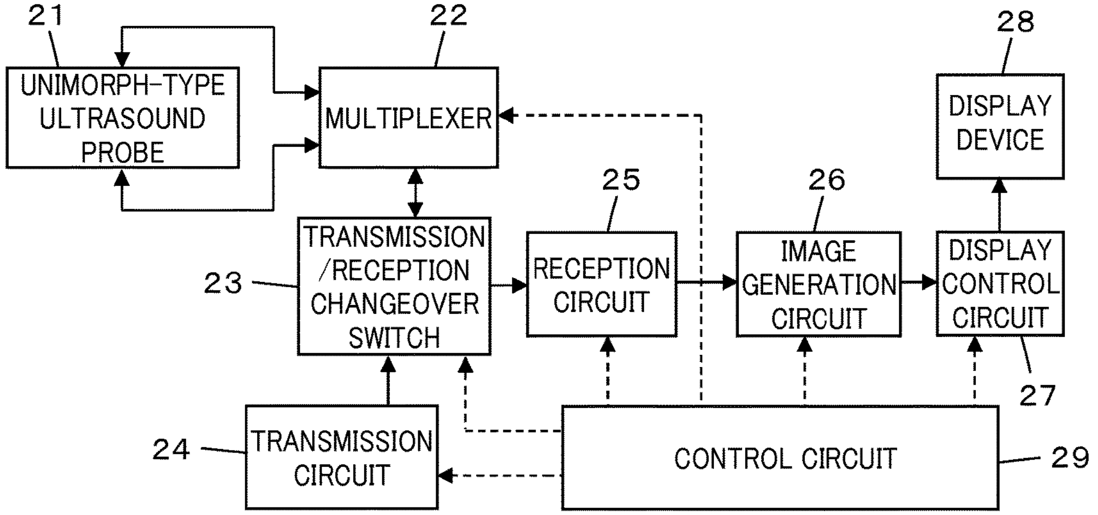
FIG. 6 is a block diagram showing the configuration of an ultrasound diagnostic apparatus using the unimorph-type ultrasound probe according to Embodiment 1.

FIG. 6 shows the constitution of an ultrasound diagnostic apparatus for generating an ultrasound image using the unimorph-type ultrasound probe 21 shown in FIG. 5. Through a multiplexer 22, a transmission/reception changeover switch 23 is connected to the unimorph-type ultrasound probe 21, and a transmission circuit 24 and a reception circuit 25 are respectively connected to the transmission/reception changeover switch 23. An image generation circuit 26 is connected to the reception circuit 25, and further, a display device 28 is connected to the image generation circuit 26 through a display control circuit 27. A control circuit 29 is connected to the multiplexer 22, the transmission/reception changeover switch 23, the transmission circuit 24, the reception circuit 25, the image generation circuit 26 and the display control circuit 27.

The multiplexer 22 is connected to the lead-out electrodes 3 extending from the corresponding piezoelectric element regions 2 through a plurality of wiring patterns 12 of the unimorph-type ultrasound probe 21, and selects the piezoelectric element region 2 for transmitting an ultrasonic wave and selects the piezoelectric element region 2 for receiving an ultrasonic echo under the control of the control circuit 29.

Under the control of the control circuit 29, the transmission/reception changeover switch 23 connects the transmission circuit 24 to the multiplexer 22 and breaks the reception circuit 25 from the multiplexer 22 at the time of transmission of an ultrasonic beam, and breaks the transmission circuit 24 from the multiplexer 22 and connects the reception circuit 25 to the multiplexer 22 at the time of reception of an ultrasonic echo.

The transmission circuit 24 includes a plurality of transmitters, for example. The transmission circuit 24 adjusts the amount of delay of each transmission signal so that ultrasonic waves transmitted from a plurality of ultrasound transducers of the unimorph-type ultrasound probe 21 form an ultrasonic beam, based on a transmission delay pattern selected according to a control signal from the control circuit 29, and supplies the adjusted transmission signals to the plurality of ultrasound transducers.

The reception circuit 25 amplifies a reception signal transmitted from each of the ultrasound transducers of the unimorph-type ultrasound probe 21, and A/D converts the amplified reception signal. Then, the reception circuit 25 gives a delay to each of the reception signals according to a sound speed or a distribution of sound speed set based on a reception delay pattern that is selected depending on a control signal from the control circuit 29, and adds the reception signals together to thereby perform reception focus processing. Reception data (sound ray signal) in which the focus of the ultrasonic echo is narrowed down is generated by this reception focus processing.

The image generation circuit 26 performs correction of attenuation due to distance on the reception data generated in the reception circuit 25, depending on the depth of the reflection position of the ultrasonic wave, and then performs envelope detection processing to generate B-mode image signals that are tomographic image information regarding a tissue of a subject. Then, the image generation circuit 26 raster-converts the B-mode image signals, performs various necessary image processing such as gradation processing on the raster-converted B-mode image signals, and then outputs the B mode image signals subjected to the image processing to the display control circuit 27.

The display control circuit 27 causes the display circuit 28 to display an ultrasound diagnostic image based on the B-mode image signals input from the image generation circuit 26.

When transmitting an ultrasonic beam, the transmission circuit 24 is connected to the multiplexer 22 through the transmission/reception changeover switch 23, and a voltage is applied between the upper electrode layer 8 and the lower electrode layer 6 of each of the plurality of piezoelectric element portions 5 in the piezoelectric element region 2 selected by the multiplexer 22. With this, the piezoelectric substance layer 7 of each of the piezoelectric element portions 5 vibrates and an ultrasonic beam is radiated. At this time, as shown in FIG. 4, since the plurality of minute piezoelectric element portions 5 are arranged in each of the piezoelectric element regions 2 such that the number of piezoelectric element portions 5 in both end portions in the minor axis direction becomes smaller than the number of piezoelectric element portions 5 in the central portion in the minor axis direction, an ultrasonic beam which is radiated from the end portion of the piezoelectric element region 2 in the minor axis direction is suppressed, and an ultrasonic beam narrowed down in the minor axis direction is formed. With this, it is possible to achieve reduction in a side lobe in the minor axis direction.

Here, with respect to the major axis direction, a voltage which becomes lower toward the piezoelectric element region 2 positioned at the end portion of the major axis direction is applied to each of the piezoelectric element portions 5 of the plurality of piezoelectric element regions 2, whereby it is possible to form an ultrasonic beam narrowed down in the major axis direction and to reduce a side lobe.

If the transmission of the ultrasonic beam ends, the transmission/reception changeover switch 23 is switched by the control circuit 29, the reception circuit 25 is connected to the multiplexer 22, and reception signals received by the plurality of piezoelectric element portions 5 in the piezoelectric element region 2 selected by the multiplexer 22 are sequentially output to the reception circuit 25 to generate reception data. Then, based on the reception data, the image generation circuit 26 generates image signals, and based on the image signals, an ultrasonic image is displayed on the display device 28 by the display control circuit 27.

Figure 7:
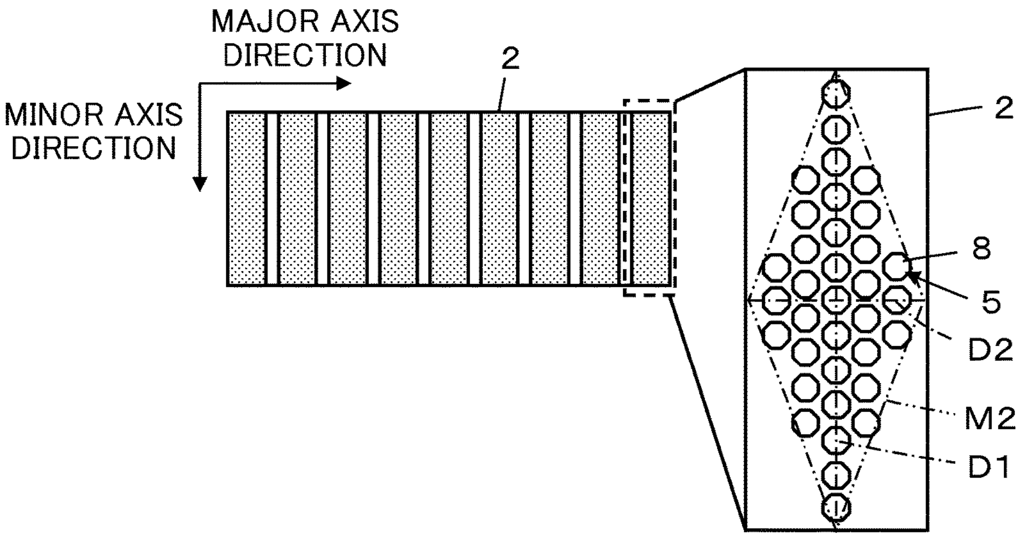
FIG. 7 is a partially enlarged plan view showing a plurality of minute piezoelectric element portions formed in a piezoelectric element region of a unimorph-type ultrasound probe according to a modification example of Embodiment 1.

In Embodiment 1 described above, although the plurality of minute piezoelectric element portions 5 are arranged in each of the piezoelectric element regions 2 so as to be spread all over the inside of the range of the hexagon M1, for example, as shown in FIG. 7, the piezoelectric element portions 5 may be arranged so as to be spread all over the inside of a range of a rhombus M2 which is set in the piezoelectric element region 2 and has a diagonal D1 along the minor axis direction and a diagonal D2 along the major axis direction. Even in this case, the number of piezoelectric element portions 5 in both end portions in the minor axis direction becomes smaller than the number of piezoelectric element portions 5 in the central portion in the minor axis direction, and as Embodiment 1, it is possible to achieve reduction in a side lobe in the minor axis direction.

The arrangement of the plurality of minute piezoelectric element portions 5 in each of the piezoelectric element regions 2 is not limited to the arrangement within the range of the hexagon M1 or the rhombus M2. The number of piezoelectric element portions 5 in both end portions in the minor axis direction is made smaller than the number of piezoelectric element portions 5 in the central portion in the minor axis direction, whereby an ultrasonic beam which is narrowed down in the minor axis direction is formed, and reduction in a side lobe in the minor axis direction is achieved.

Embodiment 2

Figure 8:
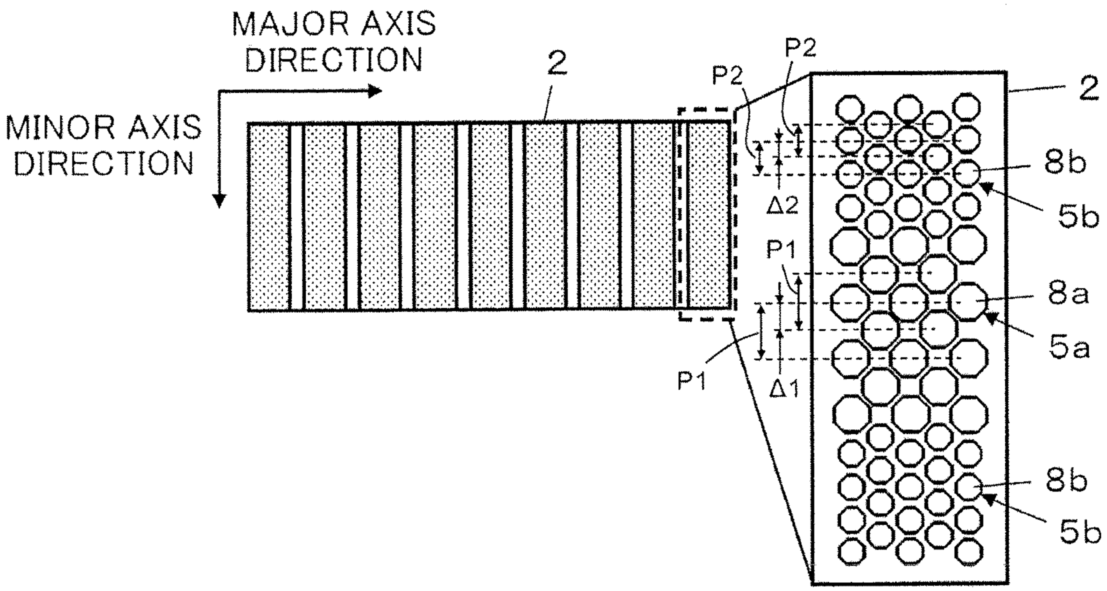
FIG. 8 is a partially enlarged plan view showing a plurality of minute piezoelectric element portions formed in a piezoelectric element region of a unimorph-type ultrasound probe according to Embodiment 2.
Figure 9A:
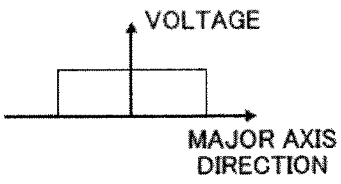
FIG. 9A is a graph showing an applied voltage to a transducer array when apodization is not used.
Figure 9B:
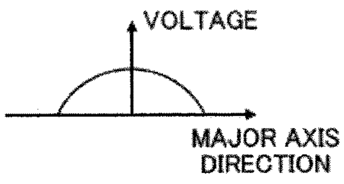
FIG. 9B is a graph showing an applied voltage to a transducer array when apodization is used.

FIG. 8 shows a plurality of minute piezoelectric element portions formed in a piezoelectric element region 2 of a unimorph-type ultrasound probe according to Embodiment 2.

In Embodiment 1 described above, although the plurality of minute piezoelectric element portions 5 in the piezoelectric element region 2 have the same size, and the number of piezoelectric element portions 5 in the minor axis direction is changed, the unimorph-type ultrasound probe according to Embodiment 2 has a plurality of first piezoelectric element portions 5*a* having a first diameter and a plurality of second piezoelectric element portions 5*b* having a second diameter smaller than the first diameter, which are arranged in each of the piezoelectric element regions 2. All of the first piezoelectric element portions 5*a* and the second piezoelectric element portions 5*b* have a regular octagonal planar shape, and the diameters of the first piezoelectric element portions 5*a* and the second piezoelectric element portions 5*b* can be defined by, for example, the average of the diameter of an inscribed circle and the diameter of a circumscribed circle of the regular octagon.

Among the lower electrode layer, the piezoelectric substance layer, and the upper electrode layer constituting the first piezoelectric element portion 5*a*, the piezoelectric substance layer and the upper electrode layer have the first diameter. Among the lower electrode layer, the piezoelectric substance layer, and the upper electrode layer constituting the second piezoelectric element portion 5*b*, the piezoelectric substance layer and the upper electrode layer have the second diameter. FIG. 8 shows a large upper electrode layer 8*a* of the first piezoelectric element portion 5*a* and a small upper electrode layer 8*b* of the second piezoelectric element portion 5*b*.

In each of the piezoelectric element regions 2, a plurality of first piezoelectric element portions 5*a* having the first diameter with a resonance frequency suitable for an inspection target are arranged in the central portion in the minor axis direction, and a plurality of second piezoelectric element portions 5*b* having the second diameter smaller than the first diameter are arranged in both end portions in the minor axis direction. The first piezoelectric element portions 5*a* are arranged in the form of straight lines at a predetermined first pitch P1 in the minor axis direction to form a plurality of first lines, and the first piezoelectric element portions 5*a* deviate from each other in a deviation amount Δ1 that is ½ of the predetermined first pitch P1 in each of the first lines. The second piezoelectric element portions 5*b* are arranged in the form of straight lines at a predetermined second pitch P2 in the minor axis direction to form a plurality of second lines, and the second piezoelectric element portions 5*b* deviate from each other in a deviation amount Δ2 that is ½ of the predetermined second pitch P2 in each of the second lines.

In the ultrasound diagnostic apparatus shown in FIG. 6, if the unimorph-type ultrasound probe according to Embodiment 2, instead of the unimorph-type ultrasound probe 21, is connected to the multiplexer 22, and by the transmission circuit 24, a voltage is applied to the plurality of first piezoelectric element portions 5*a* and the plurality of second piezoelectric element portions 5*b* in the piezoelectric element region 2 selected by the multiplexer 22, since the piezoelectric substance layers of the second piezoelectric element portions 5*b* arranged in both end portions in the minor axis direction have a diameter smaller than that of the piezoelectric substance layers of the first piezoelectric element portions 5*a* arranged in the central portion, the ultrasonic beams radiated from the second piezoelectric element portions 5*b* become weaker than the ultrasonic beams radiated from the first piezoelectric element portions 5*a* in the central portion. As a result, as in Embodiment 1, an ultrasonic beam which is narrowed down in the minor axis direction is formed, and reduction in a side lobe in the minor axis direction is achieved.

Furthermore, since the second diameter of the second piezoelectric element portion 5*b* is smaller than the first diameter of the first piezoelectric element portion 5*a*, an ultrasonic beam having a comparatively high frequency component is radiated from the second piezoelectric element portion 5*b*, and an ultrasonic beam having a comparatively low frequency component is radiated from the first piezoelectric element portion 5*a*.

In general, as an ultrasonic beam, a high frequency component has characteristics that it easily converges and it is easily attenuated, and in contrast, a low frequency component has characteristics that it is hard to converge and it is hard to be attenuated. Accordingly, in order to combine the advantages of both frequency components, in the conventional art, a method in which two components of a high frequency component and a low frequency component are included in a transmission voltage waveform and the plurality of frequency components are transmitted at one time is considered. However, it is known that if this method is used, there are problems in that the number of continuous transmission waves becomes large, input energy is increased, and heat is easily generated. As another method, a method in which images acquired at two frequencies are combined is considered. However, it is known that the method has a disadvantageous in that a frame rate is low.

In contrast, in the unimorph-type ultrasound probe according to Embodiment 2, an ultrasonic beam having a comparatively low frequency component from the first piezoelectric element portion 5*a* and an ultrasonic beam having a comparatively high frequency component from the second piezoelectric element portion 5*b* can be radiated simultaneously without causing a problem such as heat generation or low frame rate.

Furthermore, since the second diameter of the second piezoelectric element portion 5*b* is smaller than the first diameter of the first piezoelectric element portion 5*a*, an ultrasonic echo having a comparatively high frequency component is received by the second piezoelectric element portion 5*b*, and an ultrasonic echo having a comparatively low frequency component is received by the first piezoelectric element portion 5*a*. That is, after the transmission of the ultrasonic beam ends, the transmission/reception changeover switch 23 is switched by the control circuit 29 to connect the reception circuit 25 to the multiplexer 22, whereby an ultrasonic echo having a comparatively high frequency component and an ultrasonic echo having a comparatively low frequency component can be received simultaneously.

Consequently, it is possible to acquire an image with high accuracy and high invasion depth while maintaining a frame rate.

In Embodiment 2 described above, although piezoelectric element portions having two kinds of diameters including the first piezoelectric element portions 5*a* having the first diameter and the second piezoelectric element portions 5*b* having the second diameter are used, the invention is not limited thereto, and three or more kinds of piezoelectric element portions having different diameters from each other may be arranged in the piezoelectric element region 2. In this case, in the piezoelectric element region 2, it is desirable that the piezoelectric element portions be arranged such that the size of the piezoelectric element portions in both end portions in the minor axis direction becomes smaller than the size of the piezoelectric element portions in the central portion in the minor axis direction.

In the unimorph-type ultrasound probe according to Embodiments 1 and 2 described above, the piezoelectric substance layer and the upper electrode layer of each of the piezoelectric element portions have a regular octagonal planar shape, but the invention is not limited thereto, and the planar shape thereof may be, for example, a circle or a regular polygon other than a regular octagon.

What is claimed is:

1. A unimorph-type ultrasound probe having a plurality of piezoelectric element regions which extend in a minor axis direction and are arranged at a predetermined arrangement pitch in a major axis direction, wherein a plurality of minute piezoelectric element portions are formed so as to be arranged in each of the piezoelectric element regions, and wherein the plurality of minute piezoelectric element portions comprise a plurality of first piezoelectric element portions which have a first diameter and are arranged in both the minor axis direction and the major axis direction in the central portion in the minor axis direction, and a plurality of second piezoelectric element portions which have a second diameter smaller than the first diameter and are arranged in both the minor axis direction and the major axis direction in both end portions in the minor axis direction, wherein the plurality of first piezoelectric element portions are disposed so as to have a close-packed structure in which the first piezoelectric element portions are arranged in the form of straight lines at a predetermined first pitch in the minor axis direction to form a plurality of first lines, and the first piezoelectric element portions deviate from each other in a deviation amount that is ½ of the predetermined first pitch in each of the first lines, wherein the plurality of second piezoelectric element portions are disposed so as to have a close-packed structure in which the second piezoelectric element portions are arranged in the form of straight lines at a predetermined second pitch in the minor axis direction to form a plurality of second lines, and the second piezoelectric element portions deviate from each other in a deviation amount that is ½ of the predetermined second pitch in each of the second lines.

2. The unimorph-type ultrasound probe according to claim 1, wherein each of the piezoelectric element portions has a regular octagonal planar shape.

* * * * *